(12) United States Patent
Bol

(10) Patent No.: US 8,735,294 B2
(45) Date of Patent: May 27, 2014

(54) METHOD FOR FABRICATING A VERTICAL LDMOS DEVICE

(71) Applicant: International Rectifier Corporation, El Segundo, CA (US)

(72) Inventor: Igor Bol, Topanga, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/660,399

(22) Filed: Oct. 25, 2012

(65) Prior Publication Data

US 2013/0115746 A1    May 9, 2013

Related U.S. Application Data

(62) Division of application No. 12/800,037, filed on May 6, 2010, now Pat. No. 8,299,527.

(51) Int. Cl.
*H01L 21/311* (2006.01)

(52) U.S. Cl.
USPC ........... 438/700; 438/383; 438/392; 438/470; 257/E21.17; 257/E21.421; 257/E21.435; 257/E21.545

(58) Field of Classification Search
USPC ......... 438/270, 300, 301, 307, 381, 383, 389, 438/392, 439, 470, 508, 700; 257/E21.17, 257/E21.421, E21.435, E21.545
See application file for complete search history.

(56) References Cited

U.S. PATENT DOCUMENTS

| | | | | |
|---|---|---|---|---|
| 5,760,440 A | * | 6/1998 | Kitamura et al. | 257/328 |
| 5,869,875 A | * | 2/1999 | Hebert | 257/382 |
| 6,600,182 B2 | * | 7/2003 | Rumennik | 257/288 |
| 8,299,527 B2 | * | 10/2012 | Bol | 257/336 |

* cited by examiner

*Primary Examiner* — David Nhu
(74) *Attorney, Agent, or Firm* — Farjami & Farjami LLP

(57) ABSTRACT

A vertically arranged laterally diffused metal-oxide-semiconductor (LDMOS) device includes a trench extending into a semiconductor body toward a semiconductor substrate. The trench includes sidewalls, a bottom portion connecting the sidewalls, a dielectric material lining the trench and a diffusion agent layer lining the dielectric material. A lightly doped drain region adjoins the trench and extends laterally around the sidewalls from the diffusion agent layer into the semiconductor body. In one implementation, a method for fabricating a vertically arranged LDMOS device includes forming a trench extending into a semiconductor body toward a semiconductor substrate, the trench including sidewalls, a bottom portion connecting the sidewalls, a dielectric material lining the trench and a diffusion agent layer lining the dielectric material. The method further includes diffusing impurities from the diffusion agent layer through the dielectric material to form a lightly doped drain region extending laterally around the sidewalls into the semiconductor body.

18 Claims, 6 Drawing Sheets

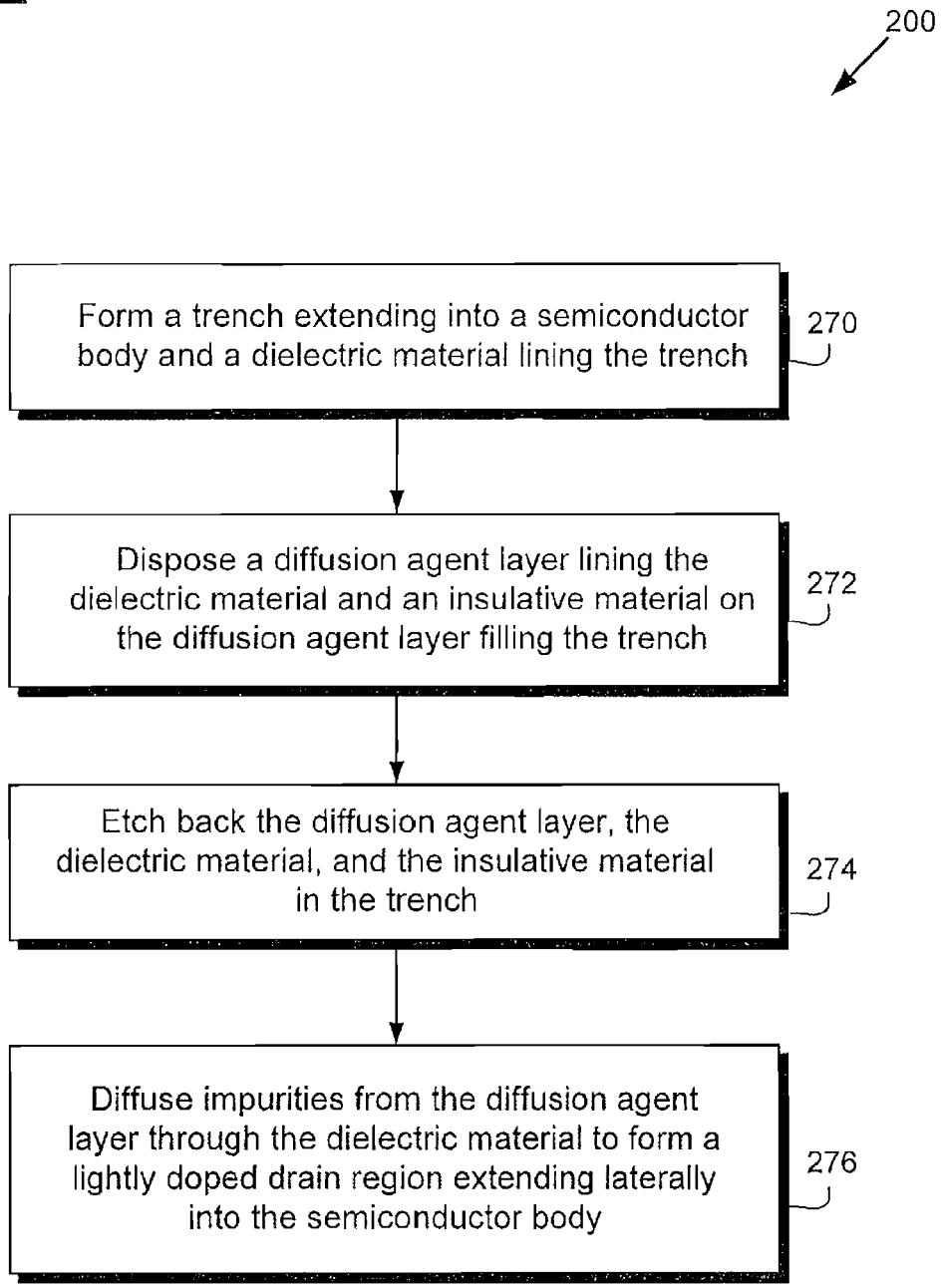

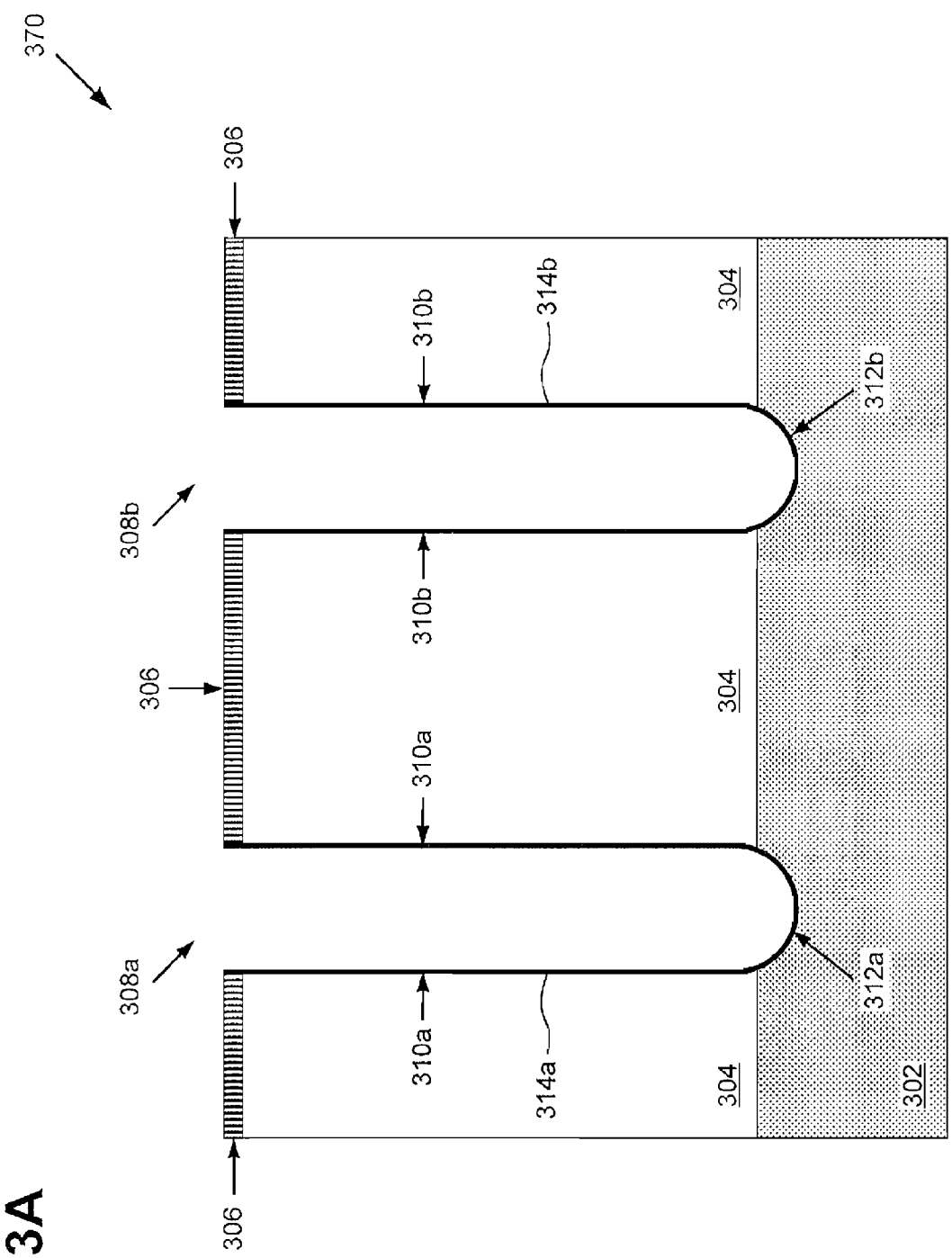

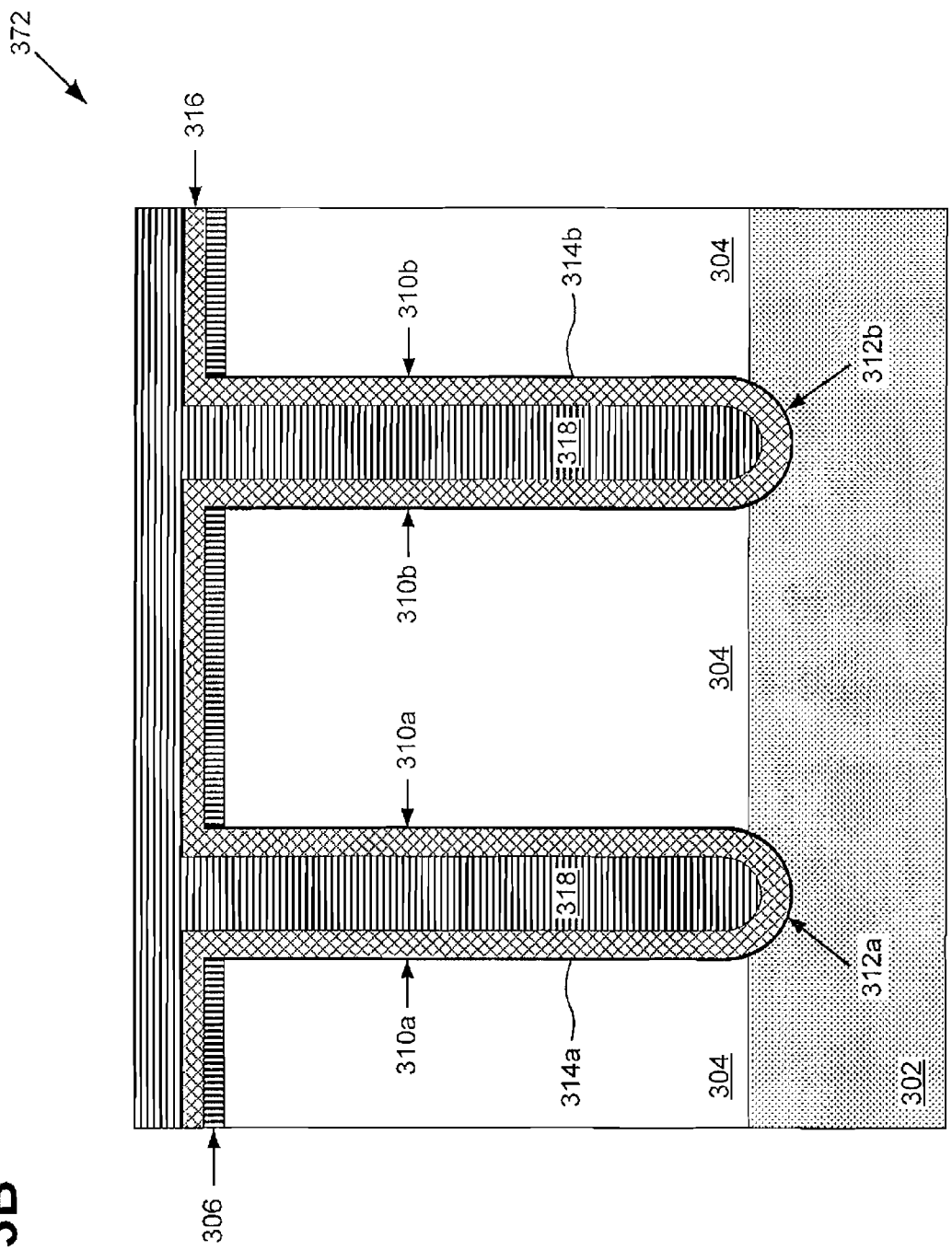

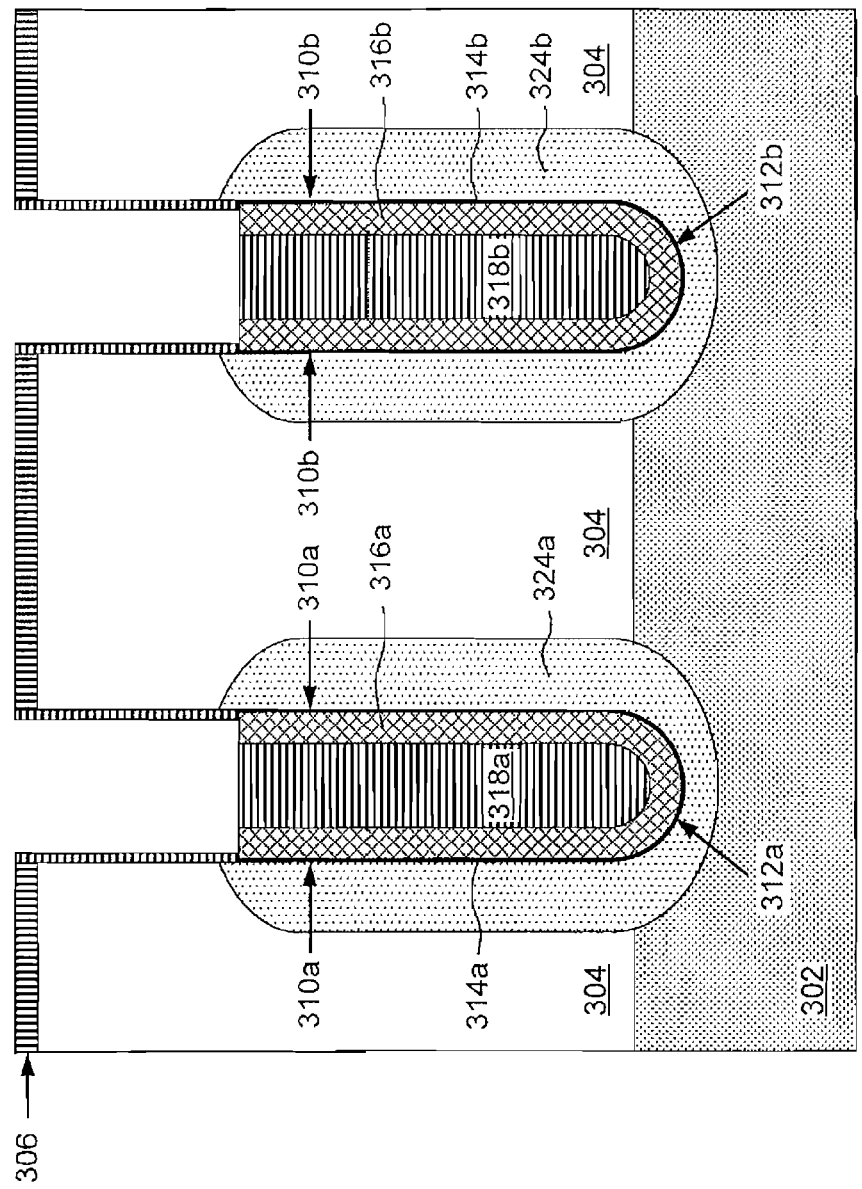

US 8,735,294 B2

METHOD FOR FABRICATING A VERTICAL LDMOS DEVICE

This is a divisional of application Ser. No. 12/800,037 filed May 6, 2010 and issued as U.S. Pat. No. 8,299,527 B2.

BACKGROUND OF THE INVENTION

1. Field of the Invention

The present invention generally relates to the field of semiconductors. More particularly, the invention relates to fabrication of trench type semiconductor devices.

2. Background Art

In many applications it is desirable for semiconductor devices to provide both high current conduction and high switching speeds. Trench type metal-oxide-semiconductor field-effect transistors (MOSFETs) can achieve high cell density and provide high current conduction. However, trench MOSFETs typically have low switching frequency, partly due to substantial junction capacitances. For example, in conventional trench MOSFETs the entire drain may contribute to feedback capacitance. Thus, conventional trench MOSFETs can exhibit large switching power losses at high frequencies.

Laterally diffused metal-oxide-semiconductor (LDMOS) transistors can have high switching speeds for given voltages, partly due to low junction capacitances. For example, in conventional LDMOS transistors, feedback capacitance is primarily comprised of gate-drain overlap, which is minimal. Thus, LDMOS transistors can be more desirable than trench MOSFETs in high frequency applications. However, LDMOS transistors generally have low cell density and low current conduction compared to trench MOSFETs.

Thus, there is a need in the art for a semiconductor device configured for high cell densities that is capable of providing both high switching speeds and high current conduction.

SUMMARY OF THE INVENTION

A vertical laterally diffused metal-oxide-semiconductor (LDMOS) device and method for fabricating same, substantially as shown in and/or described in connection with at least one of the figures, as set forth more completely in the claims.

BRIEF DESCRIPTION OF THE DRAWINGS

FIG. 2 is a flowchart showing the steps taken to implement one embodiment of the present invention.

FIG. 3A shows a cross-sectional view, which includes a portion of a wafer processed according to an embodiment of the invention, corresponding to an initial step in the flowchart in FIG. 2.

FIG. 3B shows a cross-sectional view, which includes a portion of a wafer processed according to an embodiment of the invention, corresponding to an intermediate step in the flowchart in FIG. 2.

FIG. 3D shows a cross-sectional view, which includes a portion of a wafer processed according to an embodiment of the invention, corresponding to a final step in the flowchart in FIG. 2.

DETAILED DESCRIPTION OF THE INVENTION

The present invention is directed to a vertical laterally diffused metal-oxide-semiconductor (LDMOS) device and method for fabricating same. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
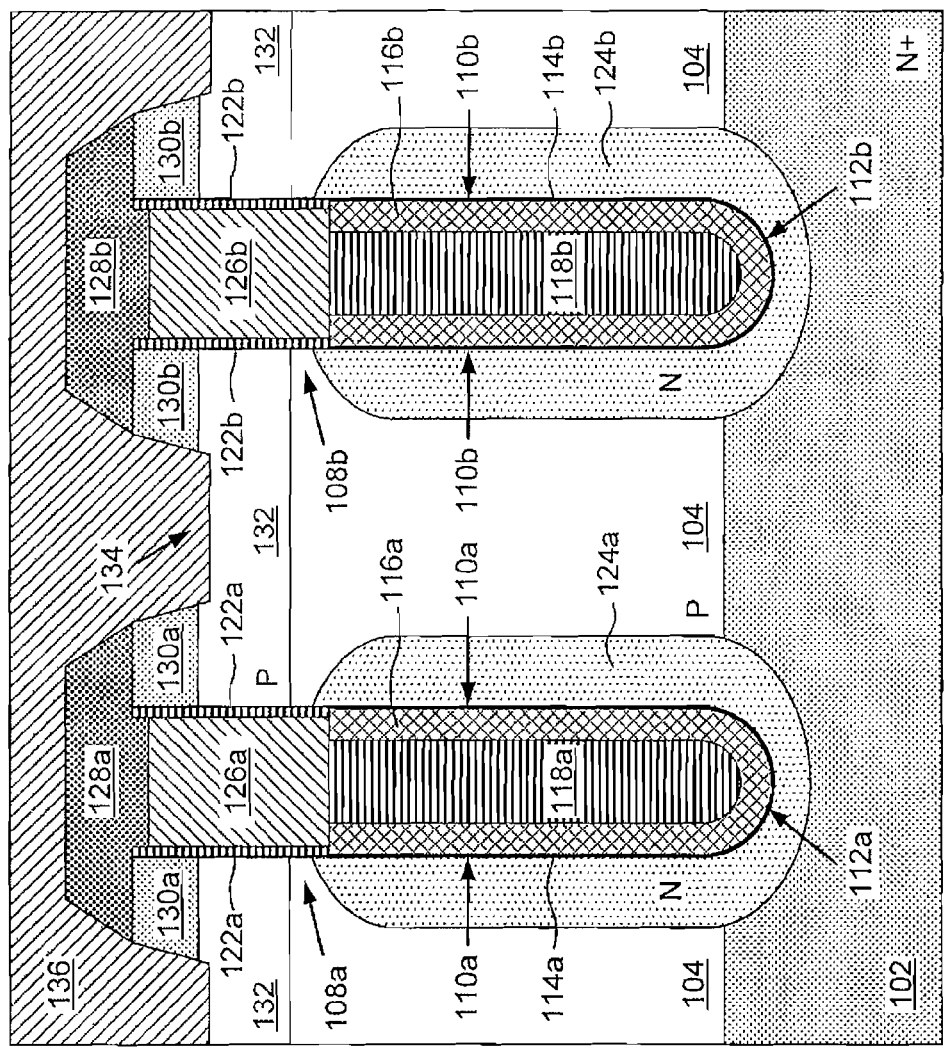
FIG. 1 shows a cross-sectional view of an exemplary vertically arranged laterally diffused metal-oxide-semiconductor device, in accordance with one embodiment of the present invention.

FIG. 1 shows a cross-sectional view of an exemplary vertically arranged LDMOS device, in accordance with one embodiment of the present invention. In FIG. 1, vertically arranged LDMOS device 100 includes substrate 102, which can comprise a semiconductor substrate, for example, such as a heavily doped N type semiconductor substrate. As shown in FIG. 1, vertically arranged LDMOS device 100 also includes semiconductor body 104, which is disposed over substrate 102 and is of opposite conductivity type from substrate 102. Semiconductor body 104 can comprise, for example, an epitaxially grown P type semiconductor layer.

As further shown in FIG. 1, vertically arranged LDMOS device 100 comprises trenches 108a and 108b. Trench 108a includes sidewalls 110a and bottom portion 112a connecting sidewalls 110a. Trench 108a further includes dielectric material 114a, diffusion agent layer 116a, insulative material 118a, gate dielectric 122a, and gate electrode 126a. In trench 108a, dielectric material 114a is disposed on sidewalls 110a and bottom portion 112a and lines trench 108a. Also in trench 108a, diffusion agent layer 116a lines dielectric material 114a. As shown in FIG. 1, insulative material 118a is disposed between sidewalls 110a and is filling trench 108a.

In vertically arranged LDMOS device 100, gate dielectric 122a and gate electrode 126a are situated over diffusion agent layer 116a, insulative material 118a, and gate dielectric 122a in trench 108a. Gate dielectric 122a is disposed on sidewalls 110a and gate electrode 126a is situated between opposing sides of gate dielectric 122a, such that, in operation, vertical inversion regions can form adjacent the opposing sides of gate dielectric 122a adjoining trench 108a.

Also in vertically arranged LDMOS device 100, trench 108b includes similar elements as trench 108a. For example, trench 108b includes sidewalls 110b, bottom portion 112b, dielectric material 114b, diffusion agent layer 116b, insulative material 118b, gate dielectric 122b, and gate electrode 126b corresponding to sidewalls 110a, bottom portion 112a, dielectric material 114a, diffusion agent layer 116a, insulative material 118a, gate dielectric 122a, and gate electrode 126a.

FIG. 1 also shows lightly doped drain regions 124a and 124b. As shown in FIG. 1, lightly doped drain region 124a is adjoining trench 108a and extends laterally around sidewalls 110a from diffusion agent layer 116a into semiconductor body 104. Similarly, lightly doped region 124b is adjoining trench 108b and extending laterally around sidewalls 110b from diffusion agent layer 116b into semiconductor body 104. In FIG. 1, lightly doped drain regions 124a and 124b are of opposite conductivity type from semiconductor body 104. For example, lightly doped drain region 124a can comprise N type semiconductor material. In vertically arranged LDMOS device 100, lightly doped drain region 124a overlaps a small portion of gate electrode 126a adjacent gate dielectric 122a in semiconductor body 104 and extends vertically toward substrate 102. Similarly, lightly doped drain region 124b overlaps a small portion of gate electrode 126b adjacent gate dielectric 122b in semiconductor body 104 and extends vertically toward substrate 102. Thus, feedback capacitance from gate-drain overlap can be minimal. In operation, lightly doped drain regions 124a and 124b, can deplete rapidly from all sides providing high switching frequency in vertically arranged LDMOS device 100.

In the embodiment shown in FIG. 1, lightly doped drain regions 124a and 124b each extend into and contact substrate 102. In other embodiments, lightly doped drain regions 124a and 124b can be disposed above substrate 102. For example, in one embodiment lightly doped drain region 124a can extend to contact a semiconductor region of the same conductivity type as lightly doped drain region 124a and substrate 102, such as, N type, where the semiconductor region is disposed between substrate 102 and semiconductor body 104. Furthermore, the semiconductor region can comprise a layer, for example, an epitaxially grown semiconductor layer, such that lightly doped drain region 124b can also extend to contact the semiconductor region. Other embodiments can include an implanted region contacting lightly doped drain region 124a and substrate 102 below trench 108a and another implanted region contacting lightly doped drain region 124b and substrate 102 below trench 108b. Furthermore, each of the regions can be implanted using respective trenches 108a and 108b.

Also shown in FIG. 1, trenches 108a and 108b extend into semiconductor body 104 toward semiconductor substrate 102. In the embodiment shown in FIG. 1, bottom portion 112a of trench 108a and bottom portion 112b of trench 108b extend into substrate 102. However, in other embodiments bottom portions 112a and 112b can be situated above substrate 102, such that, trenches 108a and 108h are also situated above substrate 102. In such embodiments, lightly doped regions 124a and 124b can each extend to contact substrate 102.

Further shown in FIG. 1, channel regions 132 and source regions 130a are formed adjacent respective sidewalls 110a of trench 108a. Similarly channel regions 132 and source regions 130b are formed adjacent respective sidewalls 110b of trench 108b. Channel regions 132 are formed over semiconductor body 104 and are of the same conductivity type as semiconductor body 104, for example, P type. As shown in FIG. 1, shared channel region 132 including recessed surface 134 is situated between opposing inner sidewalls of sidewalls 110a and 110b and over a shared portion of semiconductor body 104. Furthermore, the inner sidewalls of sidewalls 110a and 110b are spaced laterally apart by shared channel region 132 and lightly doped drain regions 124a and 124b are spaced laterally apart by semiconductor body 104.

Source regions 130a are formed over respective channel regions 132 and can comprise, for example, heavily doped N type semiconductor material. Dielectric caps 128a and 128b are disposed over respective gate electrodes 126a and 126b and fill a portion of respective trenches 108a and 108b, such that, gate electrode 126a is recessed below a surface of source regions 130a and gate electrode 126b is recessed below a surface of source regions 130b. FIG. 1 also shows source contact 136 disposed over recessed surface 134 forming an electrical contact for source regions 130a and 130b of vertically arranged LDMOS device 100.

In will be appreciated that vertically arranged LDMOS device 100 includes additional elements, for example, a drain electrode, not shown in FIG. 1 for clarity. Furthermore, various features can be modified to adjust device performance, such as, breakdown voltage. Also, vertically arranged LDMOS device 100 can include additional trenches in cellular arrangement, each cell including a trench. By allowing for closely spaced vertically arranged cells, the present invention can provide high-density LDMOS devices. As such, vertically arranged LDMOS device 100 can have significantly higher current conduction than conventional laterally arranged LDMOS devices for the same voltage. Furthermore, by reducing capacitances, the present invention can further provide for high switching frequency devices. For example, embodiments of the present invention can have switching speeds two to three times faster than conventional trench MOSFETs for the same voltage.

While an N-channel device is shown in FIG. 1, it will be appreciated that a vertically arranged LDMOS P-channel device can be formed without departing from the spirit of the present invention. Other features and advantages of vertically arranged LDMOS device 100 will be set forth with reference to the method of FIG. 2 and related FIGS. 3A-3D.

Referring to FIG. 2, FIG. 2 shows flowchart 200 describing a method for fabricating a vertically arranged LDMOS device, according to one embodiment of the present invention. Certain details and features have been left out of flowchart 200 that are apparent to a person of ordinary skill in the art. For example, a step may consist of one or more substeps or may involve specialized equipment or materials, as known in the art. Steps 270 through 276 indicated in flowchart 200 are sufficient to describe one embodiment of the present invention, however, other embodiments of the invention may utilize steps different from those shown in flowchart 200. It is noted that the processing steps shown in flowchart 200 are performed on a portion of processed wafer, which, prior to step 270, includes, among other things, a semiconductor body disposed over a substrate and pad material disposed over the semiconductor body. The processed wafer may also be referred to simply as a wafer or a semiconductor die or simply a die in the present application.

Moreover, structures 370 through 376 in FIGS. 3A through 3D show the result of performing steps 270 through 276 of flowchart 200, respectively. For example, structure 370 shows a semiconductor structure after processing step 270, structure 372 shows structure 370 after the processing of step 272, structure 374 shows structure 372 after the processing of step 274, and so forth.

Referring now to step 270 of FIG. 2 and FIG. 3A, step 270 of flowchart 200 comprises forming a trench extending into a semiconductor body and a dielectric material lining the trench. Structure 370 of FIG. 3A shows a cross-sectional view of a structure including a substrate, after completion of step 270 of flowchart 200 in FIG. 2. Structure 370 includes substrate 302, semiconductor body 304, and trenches 308a and 308b corresponding respectively to substrate 102, semiconductor body 104, and trenches 108a and 108b in FIG. 1.

As shown in FIG. 3A, structure 370 further includes pad material 306 disposed over semiconductor body 304, which can be used to protect semiconductor body 304 and can also be used to form channel regions and source regions in semiconductor body 304 after step 276, for example channel regions 132 and source regions 130a and 130b in FIG. 1. In a preferred embodiment, pad material 306 can comprise approximately 300 angstroms of silicon nitride over approximately 200 angstroms of grown oxide.

In structure 370, trenches 308a and 308b extend through pad material 306 and into semiconductor body 304 toward substrate 302. Trench 308a includes sidewalls 310a and bottom portion 312a connecting sidewalls 310a, which correspond respectively to sidewalls 110a and bottom portion 112a in FIG. 1. Similarly, trench 308b includes sidewalls 310b and bottom portion 312b connecting sidewalls 310b, which correspond respectively to sidewalls 110b and bottom portion 112b in FIG. 1. In the embodiment shown in FIG. 3A, bottom portions 312a and 312b extend into substrate 302. In another embodiment bottom portions 312a and 312b can be disposed above substrate 302 in semiconductor body 304.

Structure 370 also includes dielectric material 314a, corresponding to dielectric material 114a in FIG. 1, lining trench 308a, and dielectric material 314b, corresponding to dielectric material 114a in FIG. 1, lining trench 308b. In structure 370, dielectric material 314a is disposed on sidewalls 310a and bottom portion 312a of trench 308a and dielectric material 314b is disposed on sidewalls 310b and bottom portions 312b. Dielectric material 314a and 314b can comprise thermally grown oxide and can comprise a thickness of, for example, approximately 80-100 angstroms. The result of step 270 of flowchart 200 is illustrated by structure 370 in FIG. 3A.

Referring now to step 272 in FIG. 2 and structure 372 in FIG. 3B, at step 272 of flowchart 200, diffusion agent layer 316 is disposed lining dielectric material 314a and 314b and insulative material 318 is disposed on diffusion agent layer 316 filling the trench. As shown in FIG. 3B, diffusion agent layer 316 is disposed lining dielectric material 314a in trench 308a and dielectric material 314b in trench 308b. Diffusion agent layer 316 can comprise, for example, phosphorous-doped oxide, and can be deposited in trenches 308a and 308b using plasma-enhanced chemical vapor deposition (PECVD). Furthermore, diffusion agent layer 316 can have a thickness of for example, approximately 600-800 angstroms. Also in FIG. 3B, insulative material 318 is disposed in trenches 308a and 308b filing trenches 308a and 308b. Insulative material 318 can comprise undoped oxide deposited in-situ, for example. The result of step 272 of flowchart 200 is illustrated by structure 372 in FIG. 3B.

Figure 3C:
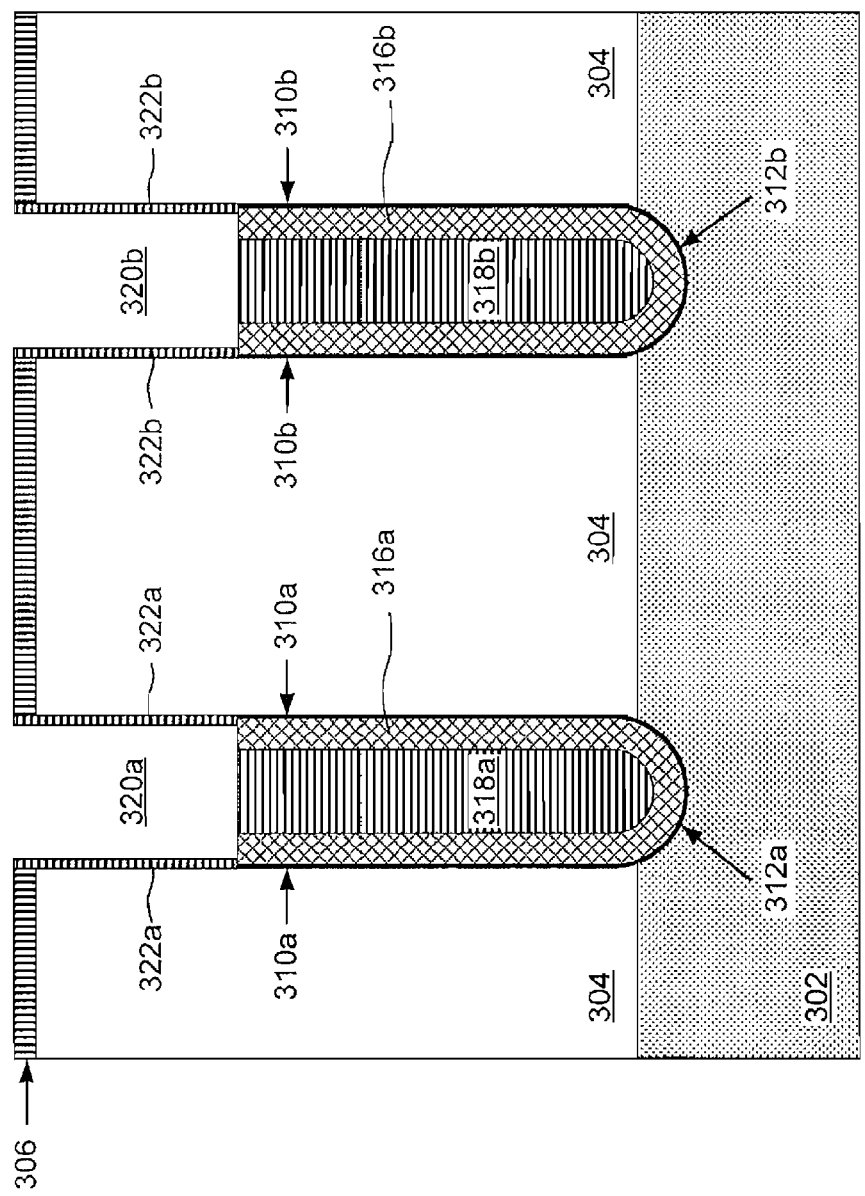
FIG. 3C shows a cross-sectional view, which includes a portion of a wafer processed according to an embodiment of the invention, corresponding to an intermediate step in the flowchart in FIG. 2.

Referring to step 274 in FIG. 2 and structure 374 in FIG. 3C, at step 274 of flowchart 200, diffusion agent layer 316, dielectric material 314a, and insulative material 318 are etched back in trench 308a forming etched trench portion 320a above diffusion agent layer 316a and insulative material 318a, which correspond respectively to diffusion agent layer 116a and insulative material 118a in FIG. 1. In one embodiment, pad material 306 can act as an etch barrier for etching back diffusion agent layer 316, dielectric material 314a, and insulative material 318.

Gate dielectric 322a is disposed in etched trench portion 320a over diffusion agent layer 316a, dielectric material 314a, and insulative material 318a. Similarly diffusion agent layer 316, dielectric material 314b, and insulative material 318 can be concurrently etched back in trench 308b forming etched trench portion 320b above diffusion agent layer 316b and insulative material 318b corresponding respectively to diffusion agent layer 116b and insulative material 118b in FIG. 1. Gate dielectric 322b is disposed in etched trench portion 320b over diffusion agent layer 316b, dielectric material 314b, and insulative material 318b. Gate dielectrics 322a and 322b are formed on respective sidewalls 310a and 310b of trenches 308a and 308b and correspond respectively to gate dielectrics 122a and 122b in FIG. 1. Furthermore, gate dielectrics 322a and 322b can comprise, for example, thermally grown oxide, and can have a thickness of approximately 200 angstroms. The result of step 274 of flowchart 200 is illustrated by structure 374 in FIG. 3C.

Referring now to step 276 in FIG. 2 and structure 376 in FIG. 3D, at step 276 of flowchart 200, impurities (i.e. dopants) are diffused from diffusion agent layer 316a through dielectric material 314a to form lightly doped drain region 324a extending laterally from diffusion agent layer 316a into semiconductor body 304. Similarly, impurities are diffused from diffusion agent layer 316b through dielectric material 314b to form lightly doped drain region 324b extending laterally from diffusion agent layer 316b into semiconductor body 304. Lightly doped drain regions 324a and 324b correspond respectively to lightly doped drain regions 124a and 124b in FIG. 1. The result of step 276 of flowchart 200 is illustrated by structure 376 in FIG. 3D.

Additional process steps can be performed on structure 376 to form vertically arranged LDMOS devices, such as, vertically arranged LDMOS device 100 in FIG. 1. Thus, as discussed above, the invention achieves a vertically arranged LDMOS device. By providing high cell density, the present invention allows for vertically arranged LDMOS devices having high current conduction. Furthermore, by minimizing capacitances, for example, feedback capacitances, the vertically arranged LDMOS devices can realize high switching speeds, which can be two to three times faster than conventional trench MOSFETs.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A method for fabricating a vertically arranged laterally diffused metal-oxide-semiconductor (LDMOS) device comprising:
    forming a trench within a semiconductor body, said trench including sidewalls, a bottom portion, a dielectric material lining said trench and a diffusion agent layer lining said dielectric material;
    diffusing impurities from said diffusion agent layer through said dielectric material to form a lightly doped drain region extending laterally from said sidewalls of said trench into said semiconductor body.

2. The method for fabricating a vertically arranged LDMOS device of claim 1, further comprising filling said trench with an insulative material.

3. The method for fabricating a vertically arranged LDMOS device of claim 1, wherein said semiconductor body is of a first conductivity type, and said lightly doped drain region is of a second conductivity type.

4. The method for fabricating a vertically arranged LDMOS device of claim 1, further comprising forming a gate electrode in said trench over said diffusion agent layer.

5. The method for fabricating a vertically arranged LDMOS device of claim 1, wherein said trench is extended into a semiconductor substrate underlying said semiconductor body.

6. The method for fabricating a vertically arranged LDMOS device of claim 5, wherein said bottom portion of said trench is disposed above said semiconductor substrate.

7. The method for fabricating a vertically arranged LDMOS device of claim 5, wherein said lightly doped drain region extends to said semiconductor substrate.

8. A method for fabricating a vertically arranged laterally diffused metal-oxide-semiconductor (LDMOS) device comprising:
   forming first and second trenches extending into a semiconductor body and a semiconductor substrate underlying said semiconductor body;
   forming a first lightly doped drain region adjoining said first trench and a second lightly doped drain region adjoining said second trench;
   wherein said first and second lightly doped drain regions are spaced apart by said semiconductor body.

9. The method for fabricating a vertically arranged LDMOS device of claim 8, wherein said first and second lightly doped drain regions are spaced laterally apart by said semiconductor body.

10. The method for fabricating a vertically arranged LDMOS device of claim 8, wherein said first and second trenches each includes sidewalls, a bottom portion, a dielectric material lining each trench and a diffusion agent layer lining said dielectric material.

11. The method for fabricating a vertically arranged LDMOS device of claim 10, wherein said first and second lightly doped drain regions extend laterally from said sidewalls of said trenches into said semiconductor body.

12. The method for fabricating a vertically arranged LDMOS device of claim 8, wherein said semiconductor body is of a first conductivity type, and said first and second lightly doped drain regions and said semiconductor substrate are of a second conductivity type.

13. The method for fabricating a vertically arranged LDMOS device of claim 10, wherein said bottom portion of each of said first and second trenches is disposed above said semiconductor substrate.

14. A method for fabricating a vertically arranged laterally diffused metal-oxide-semiconductor (LDMOS) device comprising:
   forming a trench within a semiconductor body, said trench including sidewalls, a bottom portion, a diffusion agent layer lining said sidewalls;
   diffusing impurities from said diffusion agent layer through said sidewalls to form a lightly doped drain region extending from said sidewalls into said semiconductor body.

15. The method for fabricating a vertically arranged LDMOS device of claim 14, further comprising filling said trench with an insulative material.

16. The method for fabricating a vertically arranged LDMOS device of claim 14, wherein said semiconductor body is of a first conductivity type, and said lightly doped drain region is of a second conductivity type.

17. The method for fabricating a vertically arranged LDMOS device of claim 14, further comprising forming a gate electrode in said trench.

18. The method for fabricating a vertically arranged LDMOS device of claim 14, wherein said lightly doped drain region extends into a semiconductor substrate underlying said semiconductor body.

* * * * *